United States Patent
Duan et al.

(10) Patent No.: US 10,866,039 B2
(45) Date of Patent: Dec. 15, 2020

(54) THERMAL TRANSISTOR

(71) Applicants: Tsinghua University, Beijing (CN); HON HAI PRECISION INDUSTRY CO., LTD., New Taipei (TW)

(72) Inventors: Zheng Duan, Beijing (CN); Chang-Hong Liu, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 65 days.

(21) Appl. No.: 16/231,992

(22) Filed: Dec. 25, 2018

(65) Prior Publication Data
US 2019/0212079 A1     Jul. 11, 2019

(30) Foreign Application Priority Data
Dec. 28, 2017  (CN) .......................... 2017 1 1465818

(51) Int. Cl.
*F28F 13/16*   (2006.01)
*F28C 3/00*   (2006.01)
*F28F 13/00*   (2006.01)

(52) U.S. Cl.
CPC .............. *F28F 13/16* (2013.01); *F28C 3/005* (2013.01); *F28F 2013/001* (2013.01); *F28F 2013/008* (2013.01); *F28F 2255/20* (2013.01)

(58) Field of Classification Search
CPC .................. F28F 13/16; F28F 2013/005; F28F 2013/006; F28F 2013/008; H01L 23/373; H01L 23/38
See application file for complete search history.

(56) References Cited

U.S. PATENT DOCUMENTS

| | | | | |
|---|---|---|---|---|
| 4,515,206 A | * | 5/1985 | Carr ...................... | F28F 13/16 165/104.28 |
| 4,742,867 A | * | 5/1988 | Walsh .................... | F28F 13/00 165/185 |
| 2003/0089484 A1 | * | 5/2003 | Biter ..................... | B64G 1/503 165/41 |
| 2005/0257821 A1 | * | 11/2005 | Ramanathan ........... | H01L 35/30 136/203 |
| 2008/0029145 A1 | * | 2/2008 | Sung ...................... | H01J 29/04 136/239 |

(Continued)

FOREIGN PATENT DOCUMENTS

WO    WO-2006004524 A1 * 1/2006 .............. F28F 13/16

OTHER PUBLICATIONS

Ge Song et al., Effects of Surface Charge and Electric Field on the Interfacial Thermal Resistance at Liquid/Solid Interfaces, Acta Phys.-Chim. Sin., 2012, 2939-2943, 28(12).

*Primary Examiner* — Tho V Duong
(74) *Attorney, Agent, or Firm* — ScienBiziP, P.C.

(57) ABSTRACT

A thermal transistor is provided. The thermal transistor includes a metallic thermal conductor, a non-metallic thermal conductor, and a thermal resistance adjusting unit. The metallic thermal conductor and the non-metallic thermal conductor are contact with each other to form a thermal interface. The thermal resistance adjusting unit is configured to generate an bias voltage $U_{12}$ between the metallic thermal conductor and the non-metallic thermal conductor.

10 Claims, 10 Drawing Sheets

(56) References Cited

U.S. PATENT DOCUMENTS

| | | | |
|---|---|---|---|
| 2012/0056149 A1* | 3/2012 | Cleavelin | H01L 51/0015 |
| | | | 257/9 |
| 2015/0152635 A1* | 6/2015 | Duforestel | E04B 1/80 |
| | | | 52/794.1 |
| 2017/0284096 A1* | 10/2017 | Abe | E06B 3/6715 |

* cited by examiner providing a metallic thermal conductor 10 and a non-metallic thermal conductor 20, the metallic thermal conductor 10 and the non-metallic thermal conductor 20 are in direct contact with each other to form an interface 100 ——S11 varying an electric field at the interface 100 to modulate the interfacial thermal resistance at the interface ——S12

FIG.1

THERMAL TRANSISTOR

CROSS-REFERENCE TO RELATED APPLICATIONS

The application is related to co-pending applications entitled, "THERMAL TRANSISTOR", concurrently filed Ser. No. 16/231,991; "METHOD FOR CONTROLLING THERMAL TRANSISTOR", concurrently filed Ser. No. 16/231,993.

FIELD

The present disclosure relates to the field of thermal rectification, and more particularly to thermal logical device.

BACKGROUND

Interfacial thermal resistance is a measure of an interface's resistance to thermal flow. Thermal rectification can be achieved by regulating the interfacial thermal resistance, and on this basis thermal logical device can be fabricated. However, in prior art the interfacial thermal resistance cannot be effectively controlled.

What is needed, therefore, is to provide a thermal transistor and a method for controlling the interfacial thermal resistance of the thermal transistor.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

FIG. 1 is a flow diagram of one embodiment of a method for controlling thermal transistor.

DETAILED DESCRIPTION

Figure 2:
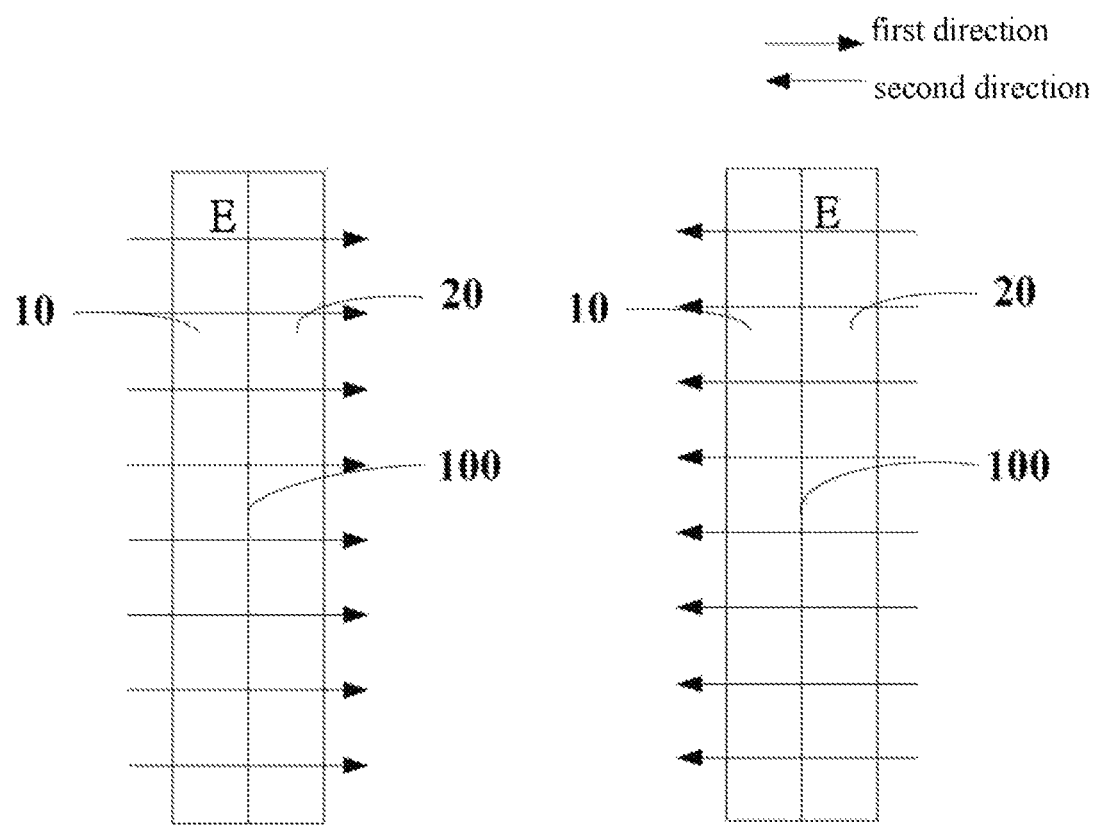
FIG. 2 is a schematic view of one embodiment of a method for controlling thermal transistor.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to be better illustrate details and features. The description is not to be considered as limiting the scope of the embodiments described herein.

Several definitions that apply throughout this disclosure will now be presented.

The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 and FIG. 2 show an embodiment of a method for modulating interfacial thermal resistance at an interface between a metallic thermal conductor 10 and a non-metallic thermal conductor 20. The method includes, at least the following blocks:

S11, providing a metallic thermal conductor 10 and a non-metallic thermal conductor 20, the metallic thermal conductor 10 and the non-metallic thermal conductor 20 are in direct contact with each other to form an interface 100; and S12, varying an electric field at the interface 100 to modulate the interfacial thermal resistance at the interface 100.

In block S11, both the metallic thermal conductor 10 and the non-metallic thermal conductor 20 are made of heat conductive materials. The metallic thermal conductor 10 can be copper, aluminum, iron, gold, silver, alloy, or the like. The non-metallic thermal conductor 20 can be electrical conductive material, such as carbon nanotubes, graphene, carbon fibers, or the like.

The metallic thermal conductor 10 is closely in contact with the non-metallic thermal conductor 20, so heat can be transferred as much as possible between the metallic thermal conductor 10 and the non-metallic thermal conductor 20. In order to ensure good contact, the surfaces of the metallic thermal conductor 10 and the non-metallic thermal conductor 20 need to be smooth to create a seamless contact surface.

The metallic thermal conductor 10 and the non-metallic thermal conductor 20 can be disposed in a sealed space to reduce interference from outside airflow. In one embodiment, the metallic thermal conductor 10 and the non-metallic thermal conductor 20 are disposed in a vacuum room.

Figure 3:
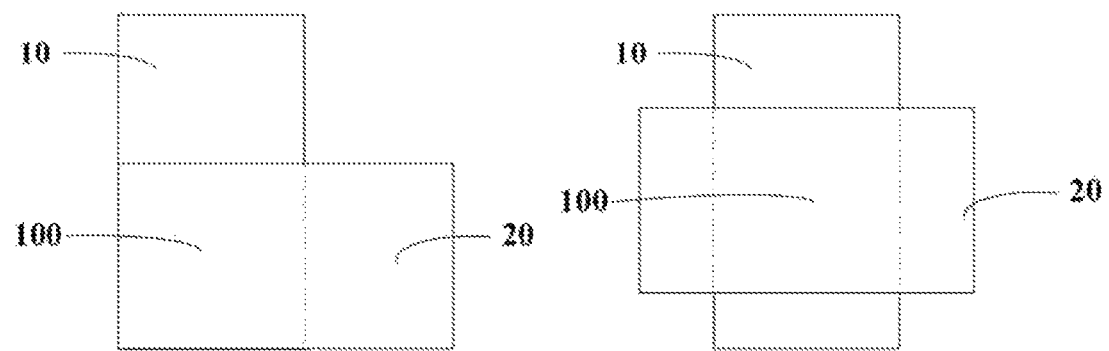
FIG. 3 is a schematic view of one embodiment of the metallic thermal conductor and the non-metallic thermal conductor.

The metallic thermal conductor 10 and the non-metallic thermal conductor 20 are stacked to form the interface 100. Specifically, the metallic thermal conductor 10 and the non-metallic thermal conductor 20 could be completely or partially overlapped. FIG. 3 shows embodiment of relative positions of the metallic thermal conductor 10 and the non-metallic thermal conductor 20.

The shape of the metallic thermal conductor 10 is not limited. The thickness of the metallic thermal conductor 10 can be ranged from about 0.1 mm to about 1 mm. The smaller is the thickness of the metallic thermal conductor 10, the easier it is to observe the change of interfacial thermal resistance.

In one embodiment, the metallic thermal conductor 10 is a copper sheet with a dimension of 15 mm in length, 15 mm in width, and 0.5 mm in thickness.

The shape of the non-metallic thermal conductor 20 is not limited. The thickness of the non-metallic thermal conductor 20 can be ranged from about 30 µm to about 120 µm. The smaller is the thickness of the non-metallic thermal conductor 20, the easier it is to observe the change of interfacial thermal resistance. The density of the non-metallic thermal conductor 20 can range from about 0.3 g/cm$^3$ to about 1.4 g/cm$^3$.

In one embodiment, the non-metallic thermal conductor 20 is made of buckypaper with a dimension of 15 mm in length, 15 mm in width, and 52 µm in thickness. The density of the buckypaper ranges from about 1.2 g/cm$^3$ to about 1.3 g/cm$^3$.

The buckypaper includes a plurality of carbon nanotubes. Adjacent carbon nanotubes are joined end to end by van der Waals attractive force therebetween along a longitudinal direction of the carbon nanotubes. In one embodiment, a method for making the buckypaper includes, at least the following blocks:

S101, providing at least one carbon nanotube array;

S102, forming a plurality of carbon nanotube films by drawing a plurality of carbon nanotubes from the at least one carbon nanotube array; and S103, stacking and pressing the carbon nanotube films.

In block S101, the carbon nanotube array is a super-aligned carbon nanotube array. In one embodiment, the carbon nanotubes are multi-walled carbon nanotubes with a diameter of about 10 nm to about 20 nm.

Figure 4:
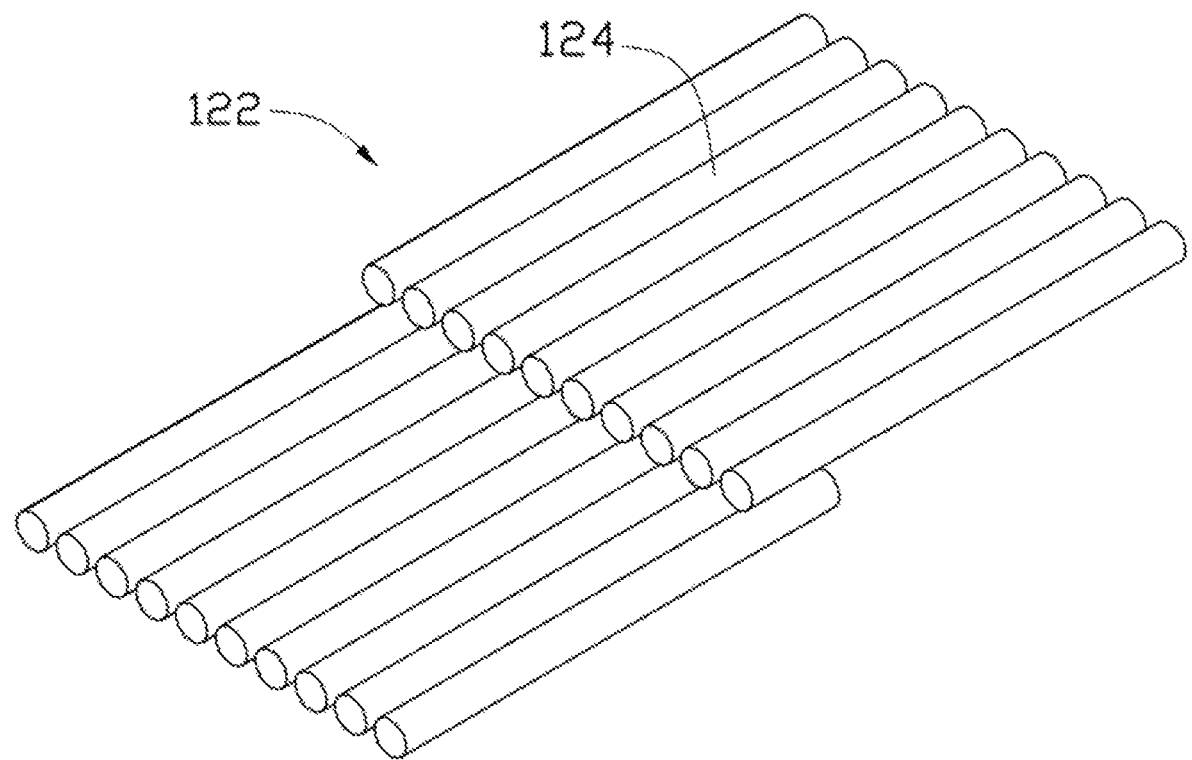
FIG. 4 is a schematic view of one embodiment of carbon nanotube segment of a carbon nanotube film.

In block S102, the carbon nanotube film includes a plurality of carbon nanotubes. Adjacent carbon nanotubes are joined end to end by van der Waals attractive force therebetween along a longitudinal direction of the carbon nanotubes. The plurality of carbon nanotubes is arranged along a direction substantially parallel to an axial direction of the carbon nanotube. Referring to FIG. 4, each carbon nanotube film includes a number of successively oriented carbon nanotube segments 122 joined end to end by Van der Waals attractive force therebetween. Each carbon nanotube segment 122 comprises a number of carbon nanotubes 124 substantially parallel to each other, and joined by Van der Waals attractive force therebetween.

In block S103, the number of layers of the carbon nanotube films ranges from about 800 layers to about 1500 layers. In one embodiment, the number of layers is about 900 layers to about 1200 layers.

In block S12, the electric field at the interface 100 could be changed by a variety of methods.

Method One

The electric field at the interface 100 can be changed by applying an external electric field E. Referring to FIG. 2, a direction perpendicular to the interface 100 and from the metallic thermal conductor 10 to the non-metallic thermal conductor 20 is defined as a first direction; a direction perpendicular to the interface 100 and from the non-metallic thermal conductor 20 to the metallic thermal conductor 10 is defined as a second direction. The external electric field E is applied to adjust the electric field at the interface 100 by changing the direction and/or strength of the external electric field E. In one embodiment, the interfacial thermal resistance at the interface 100 can be increased by increasing the magnitude of the external electric field E in the first direction.

Method Two

Figure 5:
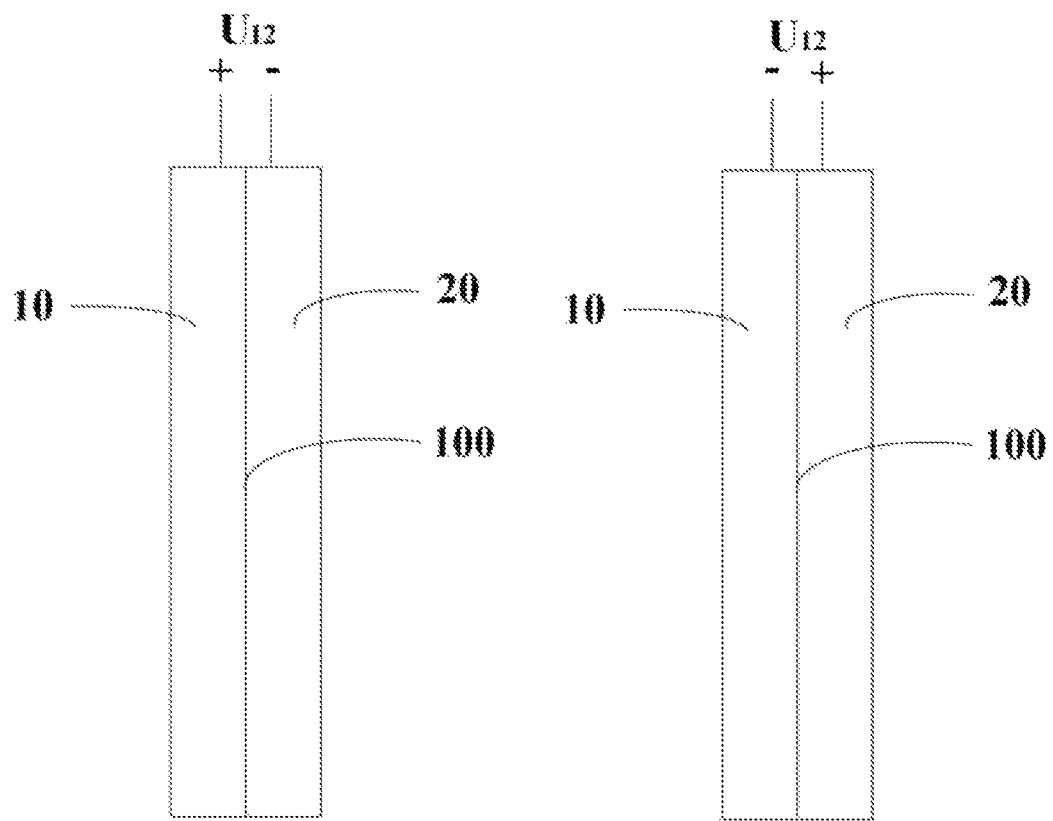
FIG. 5 is a schematic view of one embodiment of a method for controlling thermal transistor.
Figure 6:
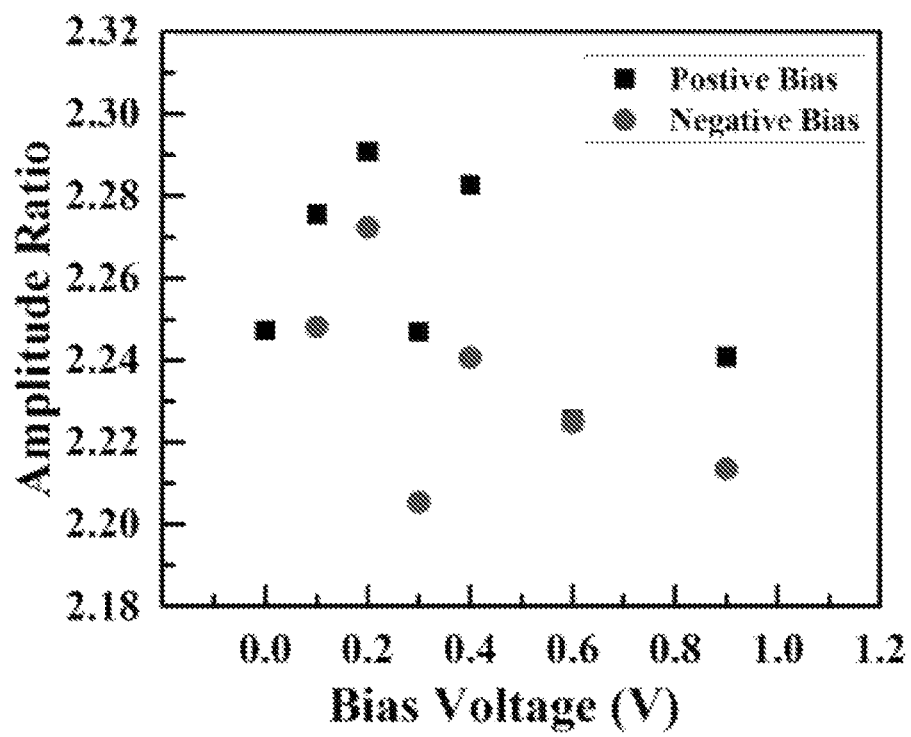
FIG. 6 is a diagram of one embodiment of bias voltage-amplitude ratios.

The electric field at the interface 100 can be changed by applying a bias voltage $U_{12}$. Referring to FIG. 5 and FIG. 6, the metallic thermal conductor 10 and the non-metallic thermal conductor 20 are respectively connected to a voltage source. The bias voltage $U_{12}$ between the metallic thermal conductor 10 and the non-metallic thermal conductor 20 depends on the shape, the size, and the material of the metallic thermal conductor 10 and the non-metallic thermal conductor 20. The bias voltage $U_{12}$ between the metallic thermal conductor 10 and the non-metallic thermal conductor 20 can be adjusted from about −3V to about 3V. In one embodiment, the bias voltage $U_{12}$ ranges from about −1V to about 1V. FIG. 6 shows the amplitude ratios of temperatures monitored by infrared thermometer I and II, respectively. It can be seen that all the amplitude ratios of positive bias are larger than that of negative bias. And larger amplitude ratio indicates decreased thermal diffusivity, which means that the thermal diffusivity is large with negative bias while the thermal diffusivity is small with positive bias. When $0V<U_{12}<0.2V$, the interfacial thermal resistance at the interface 100 increases as $U_{12}$ increases; and when $-0.9V<U_{12}<-0.4V$, the interfacial thermal resistance at the interface 100 decreases as $U_{12}$ decreases.

In one embodiment, the block S12 can further include: obtaining an electric field-interfacial thermal resistance relationship by measuring the interfacial thermal resistance of the interface 100 under different electric fields.

Figure 7:
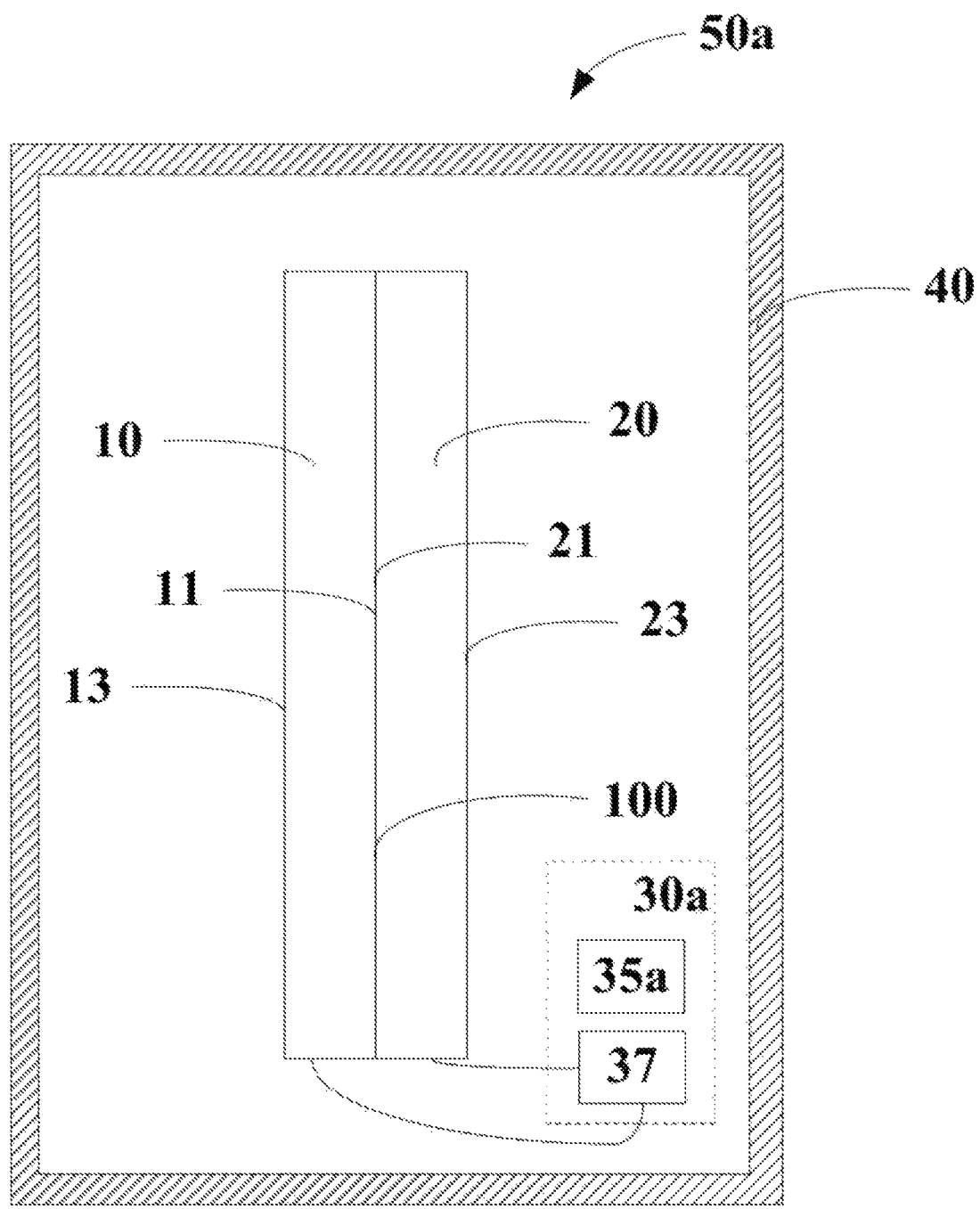
FIG. 7 is a structural schematic view of one embodiment of a thermal transistor.

FIG. 7 shows an embodiment of a thermal transistor 50a. The thermal transistor 50a includes a metallic thermal conductor 10, a non-metallic thermal conductor 20, and a thermal resistance adjusting unit 30a.

Both the metallic thermal conductor 10 and the non-metallic thermal conductor 20 are made of heat conductive materials. The metallic thermal conductor 10 can be copper, aluminum, iron, gold, silver, or the like. The non-metallic thermal conductor 20 can be made of electrical conductive material, such as carbon nanotubes, graphene, carbon fibers, or the like.

The shape of the metallic thermal conductor 10 and the non-metallic thermal conductor 20 are not limited. The thickness of the metallic thermal conductor 10 can be ranged from about 0.1 mm to about 1 mm. The thickness of the non-metallic thermal conductor 20 can be ranged from about 30 µm to about 120 µm. The smaller are the thicknesses of the metallic thermal conductor 10 and the non-metallic thermal conductor 20, the easier it is to observe the change of interfacial thermal resistance.

In one embodiment, the metallic thermal conductor 10 is a copper slice with a dimension of 15 mm×15 mm×0.5 mm, and the non-metallic thermal conductor 20 is buckypaper with a dimension of 15 mm×15 mm×52 µm.

The metallic thermal conductor 10 is closely in contact with the non-metallic thermal conductor 20, so heat can be transferred as much as possible between the metallic thermal conductor 10 and the non-metallic thermal conductor 20. The density of the buckypaper ranges from about 1.2 g/cm$^3$ to about 1.3 g/cm$^3$.

The metallic thermal conductor 10 includes a first surface 11 and a second surface 13, and the non-metallic thermal conductor 20 includes a third surface 21 and a fourth surface 23. The first surface 11 and the third surface 21 are in contact with each other to form an interface 100. The second surface 13 and the fourth surface 23 are input/output ends of the thermal transistor 50a.

In one embodiment, the first surface 11 is opposite to the second surface 13, the third surface 21 is opposite to the fourth surface 23, and the surfaces of the first surface 11 and the third surface 21 need to be smooth to ensure good contact.

The thermal resistance adjusting unit 30a is used to generate and change an electric field at the thermal interface 100. In one embodiment, the thermal resistance adjusting unit 30a includes a voltage source 37 electrically connected to the metallic thermal conductor 10 and the non-metallic thermal conductor 20, respectively. The voltage source 37 controls the potentials of the metallic thermal conductor 10 and the non-metallic thermal conductor 20. The voltage between the metallic thermal conductor 10 and the non-metallic thermal conductor 20 is defined as bias voltage $U_{12}$. The range of the bias voltage $U_{12}$ can range from −2V to 2V.

The thermal resistance adjusting unit 30a can further include a first control unit 35a electrically connected to the voltage source 37. The first control unit 35a is used to control the voltage source 37 to output a certain voltage. The first control unit 35a stores a mapping table of bias voltage $U_{12}$-interfacial thermal resistance. According to the mapping table, the first control module 35a can obtain a certain bias voltage corresponding to a given interfacial thermal resistance.

The thermal transistor 50a can further include a shell 40. The metallic thermal conductor 10, the non-metallic thermal conductor 20, and the thermal resistance adjusting unit 30a are disposed in a sealed space formed by the shell 40 which can reduce interference from external airflow.

Figure 8:
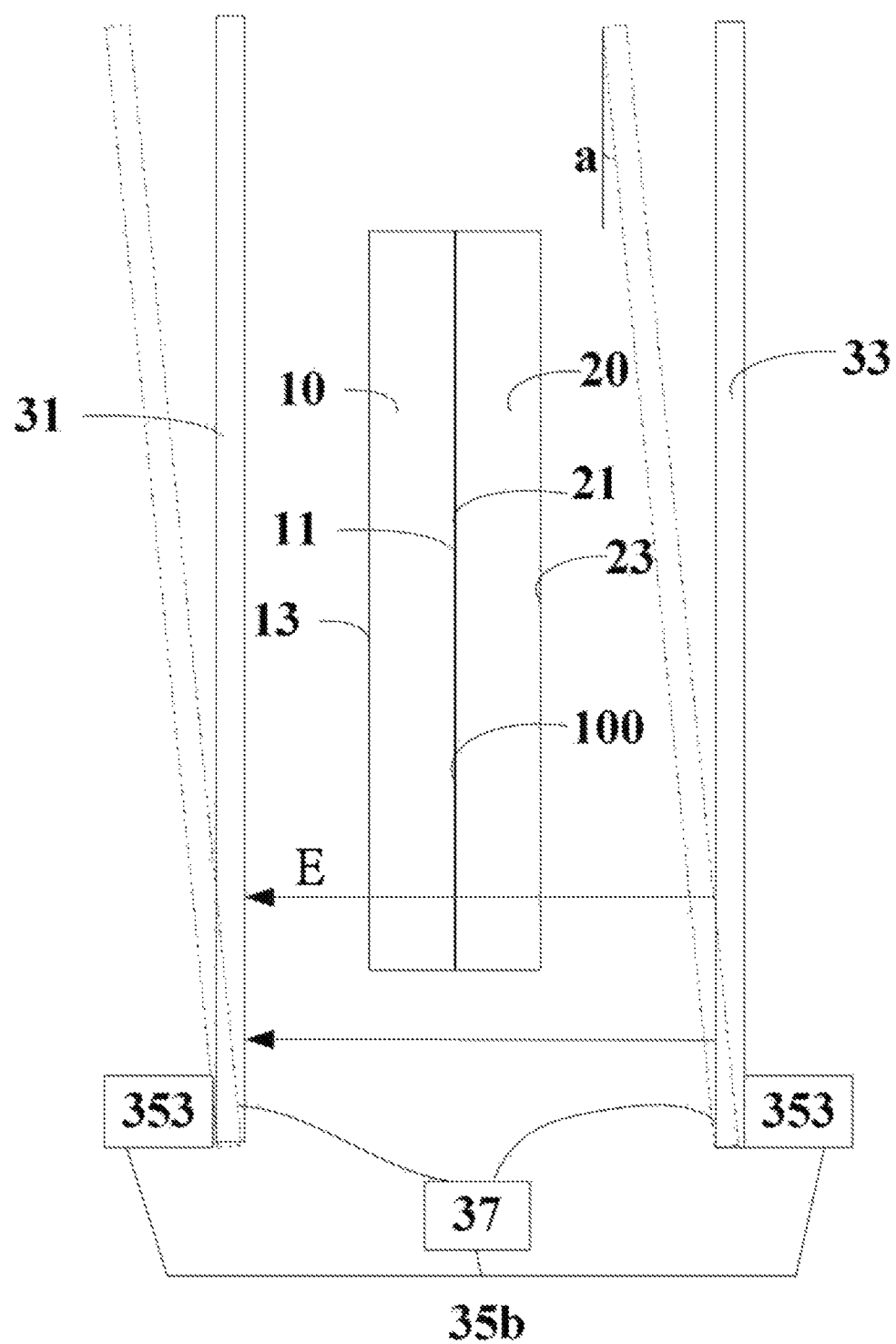
FIG. 8 is a structural schematic view of one embodiment of a thermal transistor.

FIG. 8 shows an embodiment of a thermal transistor 50b. The thermal transistor 50b includes a metallic thermal conductor 10, a non-metallic thermal conductor 20, and a thermal resistance adjusting unit.

The thermal transistor 50b in this embodiment shown in FIG. 8 is similar to the thermal transistor 50a in FIG. 7, except that the thermal resistance adjusting unit in this embodiment is used to generate an electric field E.

The thermal resistance adjusting unit is a parallel plate capacitor. The parallel plate capacitor includes a first plate 31 and a second plate 33 opposite and parallel to the first plate 31. Both the first plate 31 and the second plate 33 are electrical conductive plate.

The metallic thermal conductor 10 and the non-metallic thermal conductor 20 are disposed between the first plate 31 and the second plate 33.

The thermal resistance adjusting unit further includes a second control unit 35b used to control the electric field E generated between the first plate 31 and the second plate 33. The second control unit 35b includes a voltage source 37 and an angle adjusting unit 353. The voltage source 37 is electrically connected to the first plate 31 and the second plate 33, respectively. The angle adjusting unit 353 is connected to the first plate 31 and the second plate 33, and used to control the angle (a) between the interface 100 and the two plates 31, 33.

The second control unit 35b can further store a mapping table of electric field E-interfacial thermal resistance. According to the mapping table, the second control unit 35b can obtain a certain electric field E corresponding to a given interfacial thermal resistance.

Figure 9:
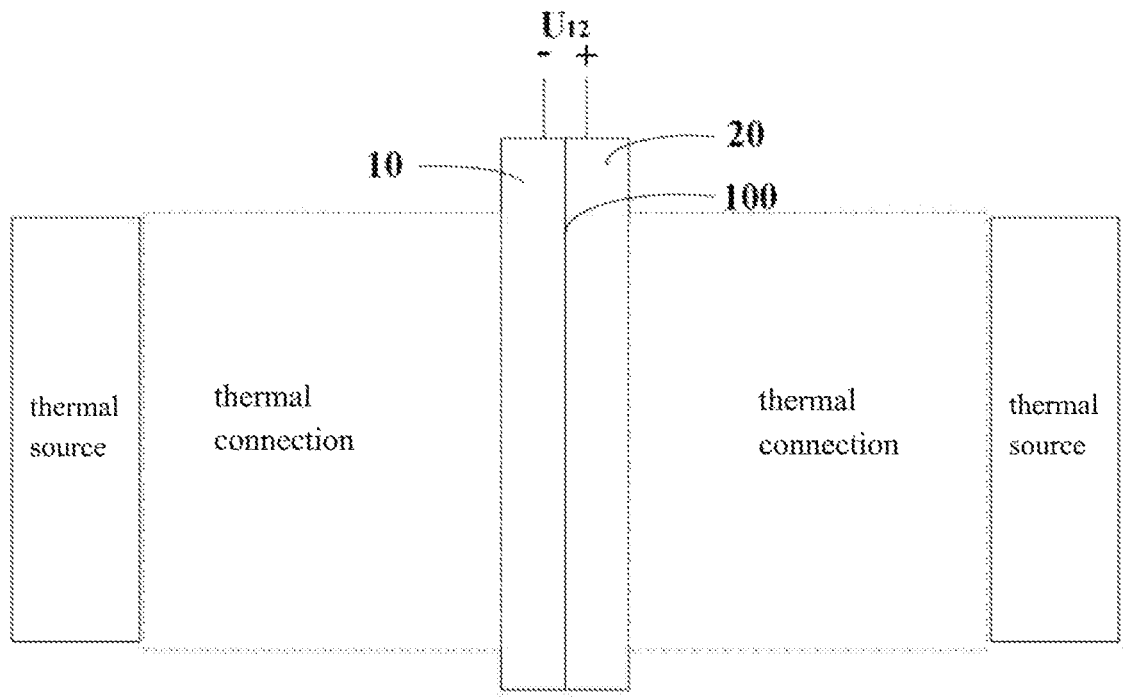
FIG. 9 is a schematic view of one embodiment of a thermal logical device.

Referring to FIG. 9, a thermal logical device can be obtained based on the thermal transistors above. The metallic thermal conductor 10 includes a first surface 11 and a second surface 13. The non-metallic thermal conductor 20 includes a third surface 21 and a fourth surface 23. The first surface 11 and the third surface 21 are in contact with each other to form an interface 100. One of the second surface 13 and the fourth surface 23 serves as input end, and the other surface serves as output end. The second surface 13 and the fourth surface 23 are thermally connected to a heat source or other thermal device. The thermal connection may be through thermal conduction, thermal radiation, and thermal convection.

Figure 10:
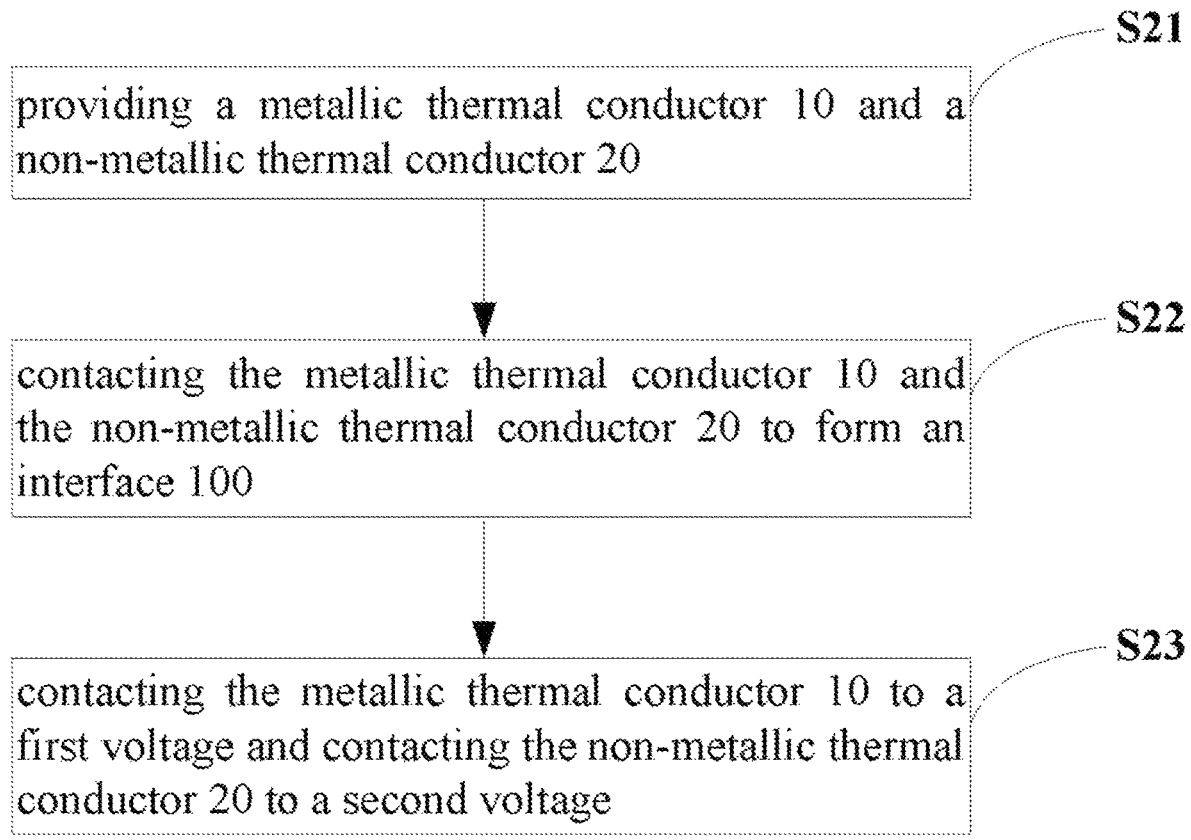
FIG. 10 is flow diagram of one embodiment of a method for making a thermal transistor.

Referring to FIG. 10, a method for making a thermal transistor is provided. The method includes, at least the following blocks:

S21, providing a metallic thermal conductor 10 and a non-metallic thermal conductor 20;

S22, contacting the metallic thermal conductor 10 and the non-metallic thermal conductor 20 to form an interface 100; and S23, contacting the metallic thermal conductor 10 to a first voltage and contacting the non-metallic thermal conductor 20 to a second voltage.

The embodiments shown and described above are only examples. Even though numerous characteristics and advantages of the present technology have been set forth in the forego description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Depending on the embodiment, certain of the steps of methods described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A thermal transistor, comprising: a metallic thermal conductor, a non-metallic thermal conductor, and a thermal resistance adjusting unit;
    the metallic thermal conductor and the non-metallic thermal conductor are in contact with each other to form a thermal interface; wherein a material of the non-metallic thermal conductor is buckypaper with a density ranging from 1.2 g/cm$^3$ to 1.3 g/cm$^3$; and
    the thermal resistance adjusting unit is configured to generate a bias voltage U12 between the metallic thermal conductor and the non-metallic thermal conductor.

2. The thermal transistor of claim 1, wherein a thickness of the metallic thermal conductor ranges from 0.1 mm to 1 mm.

3. The thermal transistor of claim 1, wherein a material of the metallic thermal conductor is selected from the group consisting of copper, aluminum, iron, gold, silver, and alloy thereof.

4. The thermal transistor of claim 1, wherein the metallic thermal conductor and the non-metallic thermal conductor are disposed in a sealed space.

5. The thermal transistor of claim 1, wherein the metallic thermal conductor and the non-metallic thermal conductor are disposed in a vacuum environment.

6. The thermal transistor of claim 1, wherein the bias voltage U12 ranges from −3V to 3V.

7. The thermal transistor of claim 1, wherein the thermal resistance adjusting unit comprises a voltage source electrically connected to each of the metallic thermal conductor and the non-metallic thermal conductor; the voltage source is configured to control electric potentials between the metallic thermal conductor and the non-metallic thermal conductor.

8. The thermal transistor of claim 7, wherein the thermal resistance adjusting unit further comprises: a first control unit electrically connected to the voltage source, the first control unit comprises a memory storing a mapping table of the bias voltage U12 versus interfacial thermal resistance.

9. The thermal transistor of claim 1, wherein the metallic thermal conductor comprises a first surface and a second surface; the non-metallic thermal conductor comprises a third surface and a fourth surface; the first surface and the third surface are in direct contact with each other to form the thermal interface.

10. The thermal transistor of claim 9, wherein each of the second surface and the fourth surface is thermally connected to a heat source or thermal device.

\* \* \* \* \*